US00RE44076E

(19) United States
(12) Reissued Patent
Chang et al.

(10) Patent Number: US RE44,076 E
(45) Date of Reissued Patent: Mar. 12, 2013

(54) DIGITAL TRANSMITTER/RECEIVER SYSTEM HAVING A ROBUST ERROR CORRECTION CODING/DECODING DEVICE AND ERROR CORRECTION CODING/DECODING METHOD THEREOF

(75) Inventors: Yong-Deok Chang, Bucheon-si (KR); Sung-woo Park, Suwon-si (KR)

(73) Assignee: Samsung Electronics Co., Ltd., Suwon-Si (KR)

(21) Appl. No.: 12/712,965

(22) Filed: Feb. 25, 2010

Related U.S. Patent Documents

Reissue of:
(64) Patent No.: 7,337,386
Issued: Feb. 26, 2008
Appl. No.: 10/851,095
Filed: May 24, 2004

U.S. Applications:
(63) Continuation of application No. 12/712,781, filed on Feb. 25, 2010.

(60) Provisional application No. 60/478,342, filed on Jun. 16, 2003, provisional application No. 60/495,873, filed on Aug. 19, 2003.

(30) Foreign Application Priority Data

Sep. 29, 2003 (KR) ..... 10-2003-0067522

(51) Int. Cl.
*H03M 13/00* (2006.01)
*H03M 13/03* (2006.01)
*H04B 1/00* (2006.01)
*H04B 3/46* (2006.01)

(52) U.S. Cl. ..... 714/784; 714/776; 714/799; 714/786; 714/752; 714/762; 375/147; 375/224; 375/227

(58) Field of Classification Search ..... 714/784, 714/776, 799, 786, 752, 762; 375/147, 224, 375/227
See application file for complete search history.

(56) References Cited

U.S. PATENT DOCUMENTS 4,998,252 A * 3/1991 Suzuki et al. ..... 714/756

(Continued)

FOREIGN PATENT DOCUMENTS

EP 0 996 292 A1 4/2000
JP 03-229548 10/1991

(Continued)

OTHER PUBLICATIONS

O. Ait Sab, et al. "Concatenated Forward Error Correction Schemes for Long-Haul DWDM Optical Transmission Systems", 25th European Conference on Optical Communication, vol. II, Sep. 26, 1999, pp. 290-291.

(Continued)

*Primary Examiner* — John J Tabone, Jr.
(74) *Attorney, Agent, or Firm* — Sughrue Mion, PLLC

(57) ABSTRACT

An error correction coding device includes a time divider for dividing field data of L packets into N data packets and (L-N) parity packets, a first RS (Reed-Solomon) encoder adding parities of a predetermined number of bytes to the data packets, respectively, a storage unit for storing the data packets, and a second RS encoder generating parity packets corresponding to the stored data packets. An error correction decoding device includes a first RS decoder correcting errors in a horizontal direction of the field data using parities of the predetermined number of bytes included in the L packets, a storage unit storing the error-corrected data packets, and a second RS decoder correcting errors in a vertical direction of the field data using the parity packets. Thus, the error correction can be strongly performed using parities existing in the horizontal and vertical directions with respect to the field data.

8 Claims, 10 Drawing Sheets

U.S. PATENT DOCUMENTS

| | | | | |
|---|---|---|---|---|
| 5,107,505 | A | 4/1992 | Lelandais et al. | |
| 5,535,191 | A * | 7/1996 | Park | 370/228 |
| 5,550,640 | A * | 8/1996 | Tsuboi et al. | 386/314 |
| 5,557,420 | A * | 9/1996 | Yanagihara et al. | 386/314 |
| 5,587,803 | A * | 12/1996 | Inoue et al. | 386/268 |
| 5,606,422 | A * | 2/1997 | Yanagihara et al. | 386/306 |
| 5,629,940 | A * | 5/1997 | Gaskill | 370/311 |
| 5,649,297 | A * | 7/1997 | Park | 455/45 |
| 5,745,644 | A * | 4/1998 | Yanagihara et al. | 386/314 |
| 5,815,046 | A | 9/1998 | Spilker, Jr. et al. | |
| 5,818,032 | A * | 10/1998 | Sun et al. | 235/494 |
| 6,029,265 | A * | 2/2000 | Itoi et al. | 714/755 |
| 6,081,301 | A | 6/2000 | Limberg | |
| 6,160,803 | A * | 12/2000 | Yuen et al. | 370/342 |
| 6,285,662 | B1 * | 9/2001 | Watanabe et al. | 370/280 |
| 6,292,921 | B1 * | 9/2001 | Daoudi et al. | 714/784 |
| 6,317,462 | B1 | 11/2001 | Boyce | |
| 6,401,228 | B1 | 6/2002 | Ichikawa et al. | |
| 6,404,817 | B1 | 6/2002 | Saha et al. | |
| 6,430,159 | B1 | 8/2002 | Wan et al. | |
| 6,453,441 | B1 | 9/2002 | Daoudi et al. | |
| 6,490,727 | B1 * | 12/2002 | Nazarathy et al. | 725/129 |
| 7,487,273 | B2 * | 2/2009 | Kobayashi | 710/62 |
| 7,577,163 | B2 * | 8/2009 | Fang | 370/468 |
| 7,653,143 | B2 * | 1/2010 | Kim et al. | 375/270 |
| 2001/0053225 | A1 | 12/2001 | Ohira et al. | |
| 2002/0181581 | A1 | 12/2002 | Birru et al. | |
| 2002/0194570 | A1 | 12/2002 | Birru et al. | |
| 2003/0053493 | A1 | 3/2003 | Graham Mobley et al. | |
| 2003/0099303 | A1 | 5/2003 | Birru et al. | |
| 2004/0109092 | A1 | 6/2004 | Markman et al. | |
| 2007/0140369 | A1 * | 6/2007 | Limberg | 375/265 |
| 2009/0052353 | A1 * | 2/2009 | D'Amico et al. | 370/280 |
| 2010/0061698 | A1 * | 3/2010 | Morello et al. | 386/85 |
| 2011/0007789 | A1 * | 1/2011 | Garmany | 375/224 |

FOREIGN PATENT DOCUMENTS

| | | | |
|---|---|---|---|
| JP | 03-229548 | A | 10/1991 |
| JP | 03-255729 | | 11/1991 |
| JP | 03-255729 | A | 11/1991 |
| JP | 11-298449 | | 10/1999 |
| JP | 11-298449 | A | 10/1999 |
| KR | 10-0155702 | B1 | 7/1998 |
| KR | 100155702 | B1 | 7/1998 |
| WO | 03/003747 | A1 | 1/2003 |

OTHER PUBLICATIONS

Omar Ait Sab, "FEC Contribution in Submarine Transmission Systems", The International Convention on Undersea Communications, May 2001, pp. 496-488.

S.D. Bate et al., "Error control techniques applicable to HF channels" IEE Proceedings, vol. 136, No. 1, part 1, Feb. 1, 1989, pp. 57-63.

Derwent Abstract and single Figure of Gwon et al (CN 4163162 A) Published Dec. 24, 2003.

Derwent Abstract and single Figure of Gwon et al. (CN 1463162 A); Published Dec. 24, 2003.*

* cited by examiner

DIGITAL TRANSMITTER/RECEIVER SYSTEM HAVING A ROBUST ERROR CORRECTION CODING/DECODING DEVICE AND ERROR CORRECTION CODING/DECODING METHOD THEREOF

Matter enclosed in heavy brackets [ ] appears in the original patent but forms no part of this reissue specification; matter printed in italics indicates the additions made by reissue.

*More than one reissue application has been filed for the reissue of U.S. Pat. No. 7,337,386 filed May 24, 2004. The present application is a continuation reissue application of U.S. application Ser. No. 12/712,781 filed Feb. 25, 2010, which is a parent reissue application of the present continuation reissue application.*

This application claims the benefit of U.S. Provisional Patent Application Nos. 60/478,342 filed Jun. 16, 2003 and 60/495,873 filed Aug. 19, 2003 in the U.S. Patent and Trademark Office, and Korean Patent Application No. 2003-67522 filed Sep. 29, 2003 in the Korean Intellectual Property Office, the disclosures of which are incorporated herein by reference.

BACKGROUND OF THE INVENTION

1. Field of the Invention

The present invention relates to a digital transmitter/receiver system, and more particularly to an error correction coding/decoding device and method for a digital transmitter/receiver system.

2. Description of the Related Art

FIG. 1 is a schematic block diagram of an error correction coding device of a transmitter system of the United States ATSC standard. Referring to FIG. 1, the error correction coding device 100 includes a randomizer 111, an RS (Reed-Solomon) encoder 113, an interleaver 115, and a trellis encoder 117.

Here, it is exemplified that the RS encoder 113 comprises an RS (207,187), t=10 code, which has an error correction capability of 10 bytes. An RS data block has a size of 207 bytes including input data of 187 bytes and an RS parity of 20 bytes, which is added for the error correction, and constitutes one segment (hereinafter referred to as "packet") along with a segment sync signal.

The input data, which is inputted from an MPEG transport system, has a structure of an MPEG2-TS (Transport Stream) in which one packet is composed of 188 bytes. The MPEG2-TS packet is composed of a 1-byte sync signal, 3-byte header including a PID (Packet Identifier), and 184-byte payload data.

The input data is converted into a random form in the randomizer 111, and the RS parity of 20 bytes for the error correction is added to the randomized data in the RS encoder 113. Then, the data is convolution-interleaved in the interleaver 115, and then trellis-encoded with a ratio of 2/3 through the trellis encoder 117.

Through the above-described process, the error correction encoding of the input data is performed.

FIG. 2 is a view illustrating the structure of a data frame for transmission. The randomization and the error correction coding are performed with respect to the input data, but are not performed with respect to the sync byte of the transport packet corresponding to the segment sync signal. That is, the data packet randomized and error-correction-coded is converted in a data frame for transmission, and a segment sync signal and a field sync signal are added to the data frame to be transmitted.

FIG. 3 is a schematic block diagram of a receiver system having an error correction decoding device corresponding to the error correction coding device of the transmitter system of FIG. 1. The error correction decoding device 300 includes a trellis decoder 311, a deinterleaver 313, an RS decoder 315 and a derandomizer 317 in the reverse order of the error correction coding device 100 of the transmitter system.

The error correction decoding device 300 of the receiver system as described above corrects an error occurring in the transmission channel environment and the transmitter system. Especially, the RS encoder 113 and the RS decoder 315 serve to correct a burst error in association with the convolution interleaver/deinterleaver.

Recently, as the necessity for indoor, portable and mobile receiving services of ground-wave digital broadcasts is increasing, it is required to stably receive data even in the inferior channel environments. However, the error correction coding method of the existing ATSC transmission system cannot guarantee a stable receiving of data in the inferior channel environment where many errors occur. Thus, there is a demand for a strong error correction coding device and method having a capability of correcting more errors.

SUMMARY OF THE INVENTION

The present invention has been developed in order to solve the above drawbacks and other problems associated with the conventional arrangement. An aspect of the present invention is to provide a digital transmitter/receiver system having a strong error correction coding/decoding device that can guarantee a receiving performance in an inferior channel environment, and an error correction coding/decoding method thereof.

To achieve the above aspects and/or other features of the present invention, there is provided an error correction coding device for a digital transmitter system comprising a first RS (Reed-Solomon) encoder for adding parities of a predetermined number of bytes to a predetermined number of data packets, respectively, a storage unit for storing the data packets having the parities of the predetermined number of bytes added thereto, and a second RS encoder for generating the parity packets corresponding to the stored data packets, wherein the first RS encoder adds the parities of the predetermined number of bytes to the parity packets, and the storage unit stores the parity packets having the parities of the predetermined number of bytes added thereto. Here, the data packet is one of a normal data packet and a robust data packet.

The second RS encoder generates the parity packets corresponding to a remaining part of the data packets except for a header part.

In an exemplary embodiment of the present invention, the error correction coding device further comprises a header inserter for inserting headers to the parity packets generated from the second RS encoder, respectively, and a randomizer for randomizing the data packets and the parity packets in a predetermined pattern before the first RS encoder adds the parities of the predetermined number of bytes thereto.

In another embodiment of the present invention, there is provided an error correction coding method comprising a first encoding step of adding parities of a predetermined number of bytes to a predetermined number of data packets, respectively, a step of storing the data packets having the parities of the predetermined number of bytes added thereto, a second encoding step of generating the parity packets corresponding to the stored data packets, and a third encoding step of adding the parities of the predetermined number of bytes to the parity packets.

The second encoding step generates the parity packets corresponding to a remaining part of the data packets except for a header part.

In an exemplary embodiment of the present invention, the error correction coding method further comprises the steps of inserting headers to the parity packets generated at the second encoding step, and randomizing the data packets and the parity packets in a predetermined pattern before the first encoding step and the third encoding step.

In still another embodiment of the present invention, there is provided an error correction decoding device for a digital receiver system comprising a first RS (Reed-Solomon) decoder for correcting errors of a predetermined number of data packets using parities of a predetermined number of bytes included in the data packets, a storage unit for storing the error-corrected data packets, and a second RS decoder for correcting errors of the data packets using the parity packets, wherein the second RS decoder updates the data packets stored in the storage unit based on the error-corrected data packets. Here, the data packet is one of a normal data packet and a robust data packet.

In an exemplary embodiment of the present invention, the error correction decoding device further comprises a randomizer for derandomizing the parity packets in a predetermined pattern, and the second RS decoder corrects the errors of the data packets using the derandomized parity packets. Also, the first RS decoder performs the error correction once again with respect to the updated data packets.

In still another embodiment of the present invention, there is provided an error correction decoding method comprising a first decoding step of correcting errors of a predetermined number of data packets using parities of a predetermined number of bytes included in the data packets, a step of storing the error-corrected data packets, a second decoding step of correcting errors of the data packets error-corrected at the first decoding step using the parity packets, a step of updating the stored data packets based on the data packets error-corrected at the second decoding step, and a third decoding step of correcting errors of the updated data packets using the parities of the predetermined number of bytes.

In an exemplary embodiment of the present invention, the error correction decoding method further comprises the steps of derandomizing the parity packets in a predetermined pattern before the second decoding step, and randomizing the derandomized parity packets in the predetermined pattern before the third decoding step.

Accordingly, the transmitter generates parities of the predetermined number of bytes included in the packets and the predetermined number of parity packets, and the receiver performs an error correction using the parities of the predetermined number of bytes and the predetermined number of parity packets, so that a stronger error correction can be achieved.

BRIEF DESCRIPTION OF THE DRAWINGS

The above aspects and features of the present invention will be more apparent by describing certain embodiments of the present invention with reference to the accompanying drawings, in which.

DETAILED DESCRIPTION OF THE ILLUSTRATIVE NON-LIMITING EMBODIMENTS

Figure 1:
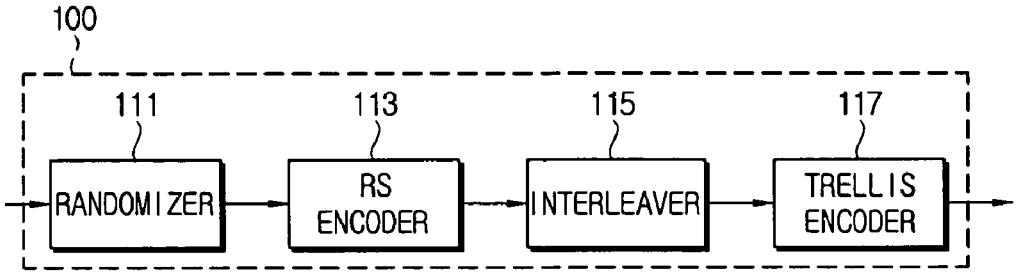
FIG. 1 (PRIOR ART)
FIG. 1 is a schematic block diagram of an error correction coding device of a conventional ATSC transmitter system.
Figure 2:
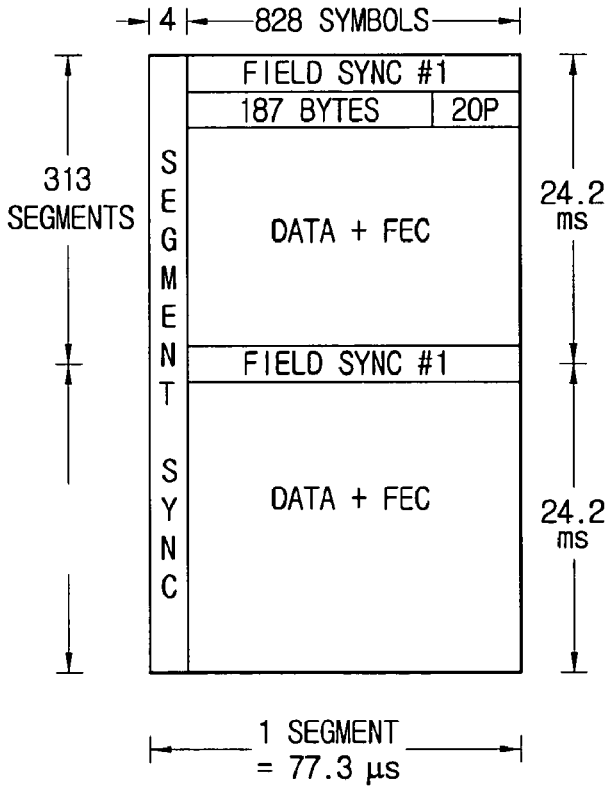
FIG. 2 (PRIOR ART)
FIG. 2 is a view illustrating the structure of a data frame coded through the error correction coding device of FIG. 1.
Figure 3:
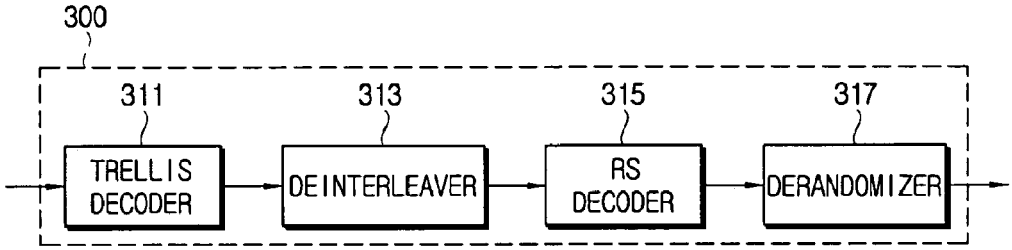
FIG. 3 (PRIOR ART)
FIG. 3 is a schematic block diagram of an error correction coding device of a conventional ATSC receiver system.

Certain embodiments of the present invention will be described in greater detail with reference to the accompanying drawings.

In the following description, same drawing reference numerals are used for the same elements even in different drawings. The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

Figure 4:
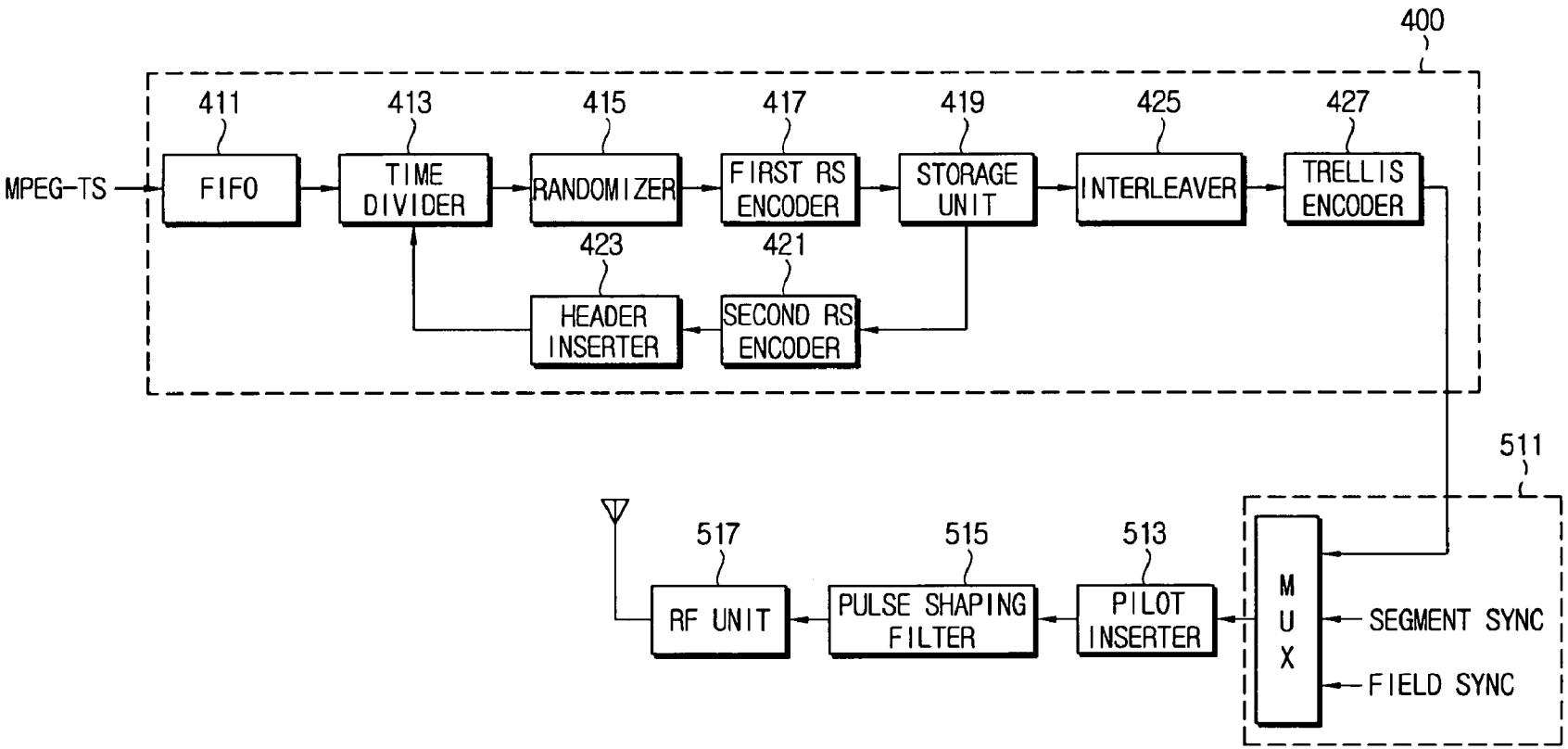
FIG. 4 is a schematic block diagram of a digital transmitter system having an error correction coding device according to an embodiment of the present invention.

FIG. 4 is a schematic block diagram of a digital transmitter system having an error correction coding device according to an embodiment of the present invention.

The digital transmitter system includes an error correction coding device 400 according to the present invention, a sync inserter 511, a pilot inserter 513, a pulse shaping filter 515, and an RF unit 517.

The error correction coding device 400 according to an embodiment of the present invention includes a FIFO (First-In First-Out) unit 411, a time divider 413, a randomizer 415, a first RS encoder 417, a storage unit 419, a second RS encoder 421, a header inserter 423, an interleaver 425, and a trellis encoder 427.

The FIFO unit 411 buffers data packets MPEG2-TS-packetized by an MPEG transmitter system (not illustrated) in a FIFO manner. Here, the data packet may be either of a normal data packet and a robust data packet that is more robust than the normal data packet in the channel environment.

The time divider 413 divides a field time with respect to the data packets outputted from the FIFO unit 411 and parity packets outputted from the header inserter 423. For example, it divides L packets except for field sync signals into N data packets and (L-N) parity packets.

The randomizer 415 randomizes the N data packets or the (L-N) parity packets outputted from the time divider 413 in accordance with a predetermined pattern. That is, the randomizer 415 first randomizes the N data packets outputted from the FIFO unit 411, and then randomizes the (L-N) parity packets.

The first RS encoder 417 adds parities of a predetermined number of bytes to the respective randomized packets. The first RS encoder 417 first adds parities to the N randomized data packets, and then adds parities to the (L-N) parity packets.

The storage unit 419 stores the packets to which the parities are added by the first RS encoder 417.

The second RS encoder 421 generates the (L-N) parity packets based on the N data packets stored in the storage unit 419. That is, the second RS encoder 421 adds the parities of (L-N) bytes corresponding to the (L-N) packets.

The header inserter 423 inserts headers of a predetermined number of bytes to the (L-N) parity packets generated from the second RS encoder 421. The (L-N) header-inserted parity packets are inputted to the time divider 413, and then outputted to the randomizer 415 through the time divider 413.

Thereafter, the (L-N) parity packets are randomized through the randomizer 415, and the parities of the predetermined number of bytes are added to the (L-N) packets through the first RS encoder 417. The (L-N) packets having the parities added thereto are then stored in the storage unit 419.

The interleaver 425 interleaves the L packets to which the parities of the predetermined number of bytes are added to rearrange the L packets in the unit of a byte, and the trellis encoder 427 trellis-encodes the interleaved data to rearrange the interleaved data in the unit of a bit.

The data, error-correction-coded by the error correction coding device 400 as described above, is inputted to the sync inserter 511, and a segment sync signal and a field sync signal are inserted into the data. The pilot inserter 513 generates a pilot signal having a power lower than an average power of symbol data, and adds the pilot signal to the data. The pulse shaping filter 515 is a filter having a specified roll-off factor, and performs a pulse shaping of the data. The RF unit 517 up-converts the data into an RF channel band signal to be transmitted, and outputs the RF channel band signal to an antenna.

Figure 5:
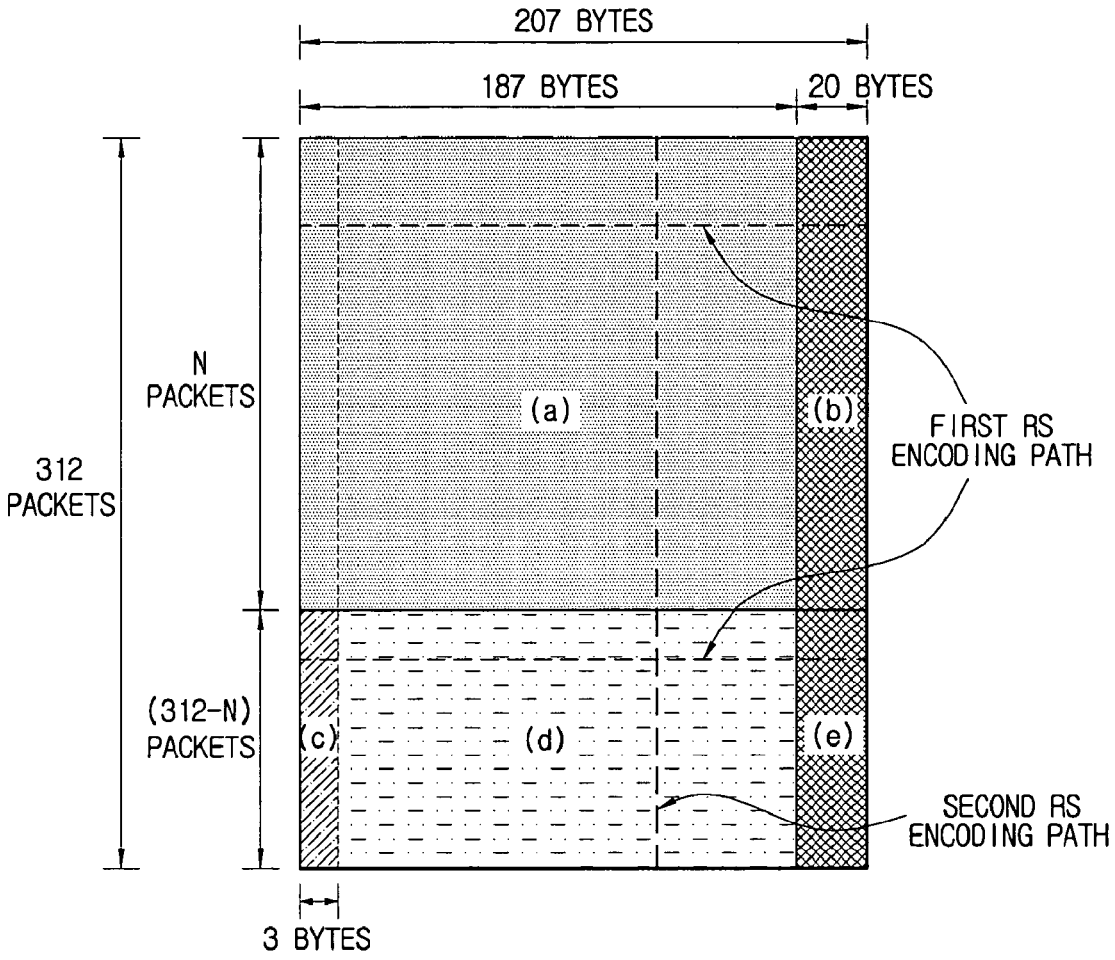
FIG. 5 is a view illustrating the structure of a data frame coded through the error correction coding device of FIG. 4.
Figure 6:
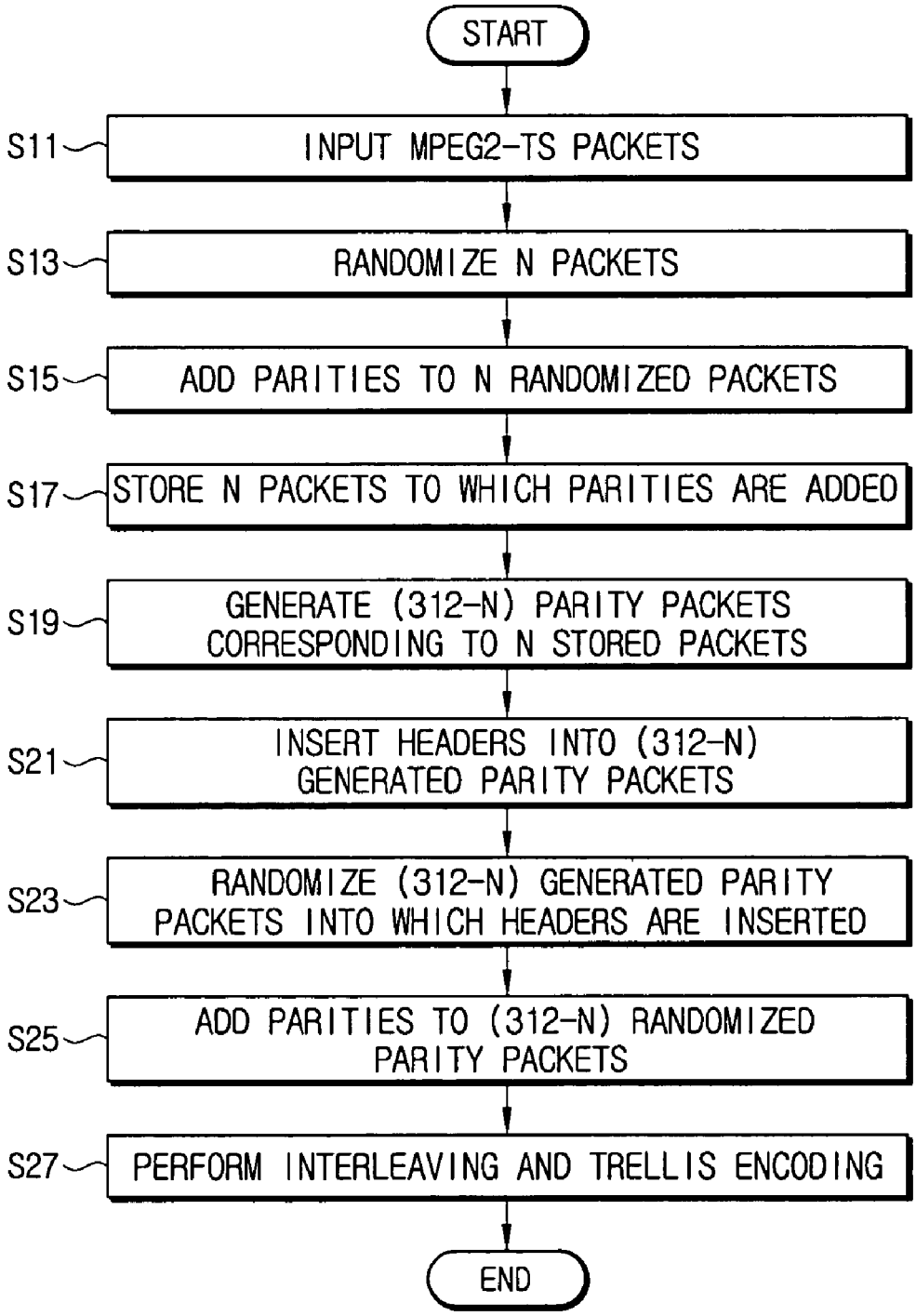
FIG. 6 is a flowchart illustrating an error correction coding method performed by the error correction coding device of FIG. 4.

FIG. 5 is a view illustrating the structure of a transmitted data frame of the ATSC standard to which the error correction coding according to the present invention is applied, and FIG. 6 is a flowchart illustrating an error correction coding method performed by the digital transmitter system illustrated in FIG. 4. Hereinafter, the error correction coding process according to the present invention will be explained in detail with reference to FIGS. 4 to 6.

The data packets MPEG2-TS-packetized by the MPEG transmitter system (not illustrated) are inputted to the FIFO unit 411 (step S11). The N data packets ((a) in FIG. 5) outputted from the FIFO unit 411 are inputted and randomized by the randomizer 415 via the time divider 413 (step S13).

The first RS encoder 417 adds a 20-byte parity ((b) in FIG. 5) to each of the N randomized packets (step S15).

The N packets to which the 20-byte parities are added ((a) and (b) in FIG. 5) are stored in the storage unit 419 (step S17). Here, it is exemplified that the first RS encoder 417 comprises an RS (207,187), t=10 code, which has an error correction capability of 10 bytes.

When the N packets ((a) and (b) in FIG. 5), to which 20-byte parities are added, are stored in the storage unit 419, the second RS encoder 421 generates (312-N)-byte parities ((d) in FIG. 5) in vertical fashion with respect to the stored N packets excluding the header and the 20-byte parities (step S19). As a result, (312-N) parity packets are generated.

Alternatively, the second RS encoder 421 may generate (312-N) parity packets ((d) and (e) in FIG. 5) in vertical fashion, with respect to the N packets excluding the header, which are the N packets being stored in the storage unit 419 and to which 20-byte parities are added. After that, the 204-byte parity packets ((d) and (e) in FIG. 5) containing parities are rearranged to generate (312-N) parity packets with respect to the N data packets.

The header inserter 423 inserts 3-byte headers to the (312-N) parity packets ((d) in FIG. 5) (step S21). The 3-byte header ((c) in FIG. 5) includes a PID (Packet Identifier) for discriminating the N data packets from the (312-N) parity packets.

The (312-N) parity packets ((c) and (d) in FIG. 5) outputted from the header inserter 423 are randomized through the randomizer 415 after passing through the time divider 413 (step S23).

The 20-byte parities ((e) in FIG. 5) are added to the randomized parity packets ((c) and (d) in FIG. 5) through the first RS encoder 417, and then the parity packets are stored in the storage unit 419 (step S25). Finally, data of one field is stored in the storage unit 419 as shown in FIG. 5.

Then, the packets are rearranged in the unit of a byte through the interleaver 425, and then rearranged in the unit of a bit through the trellis encoder 427 to complete the error correction coding (step S27).

Figure 7:
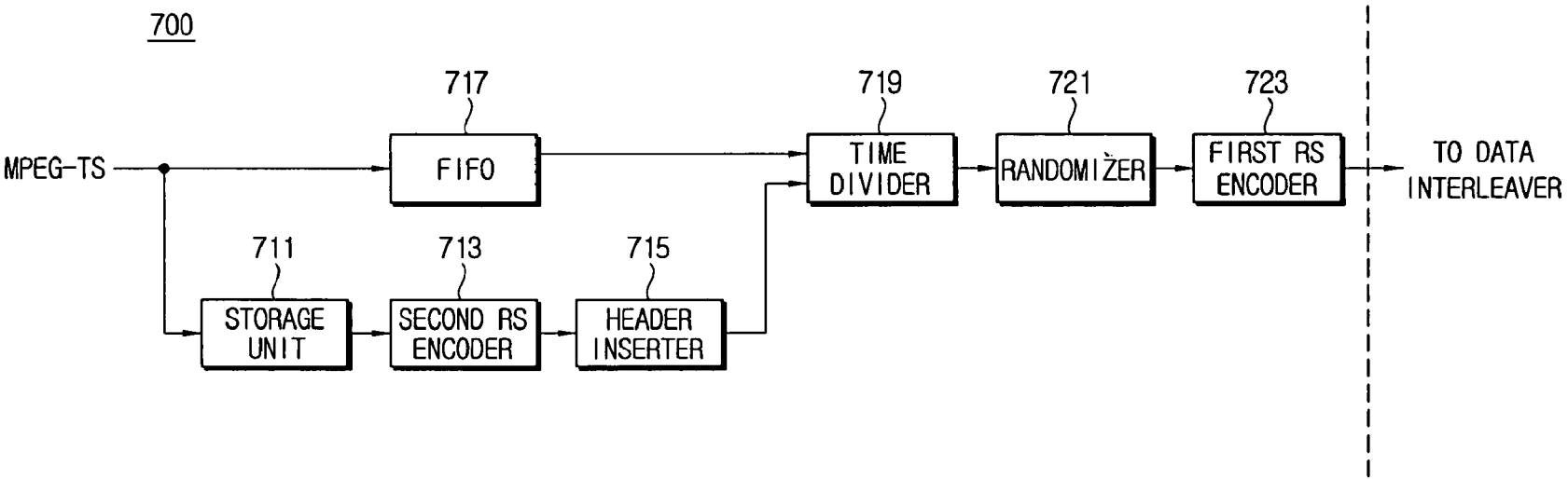
FIG. 7 is a block diagram of an error correction coding device according to another embodiment of the present invention.
Figure 8:
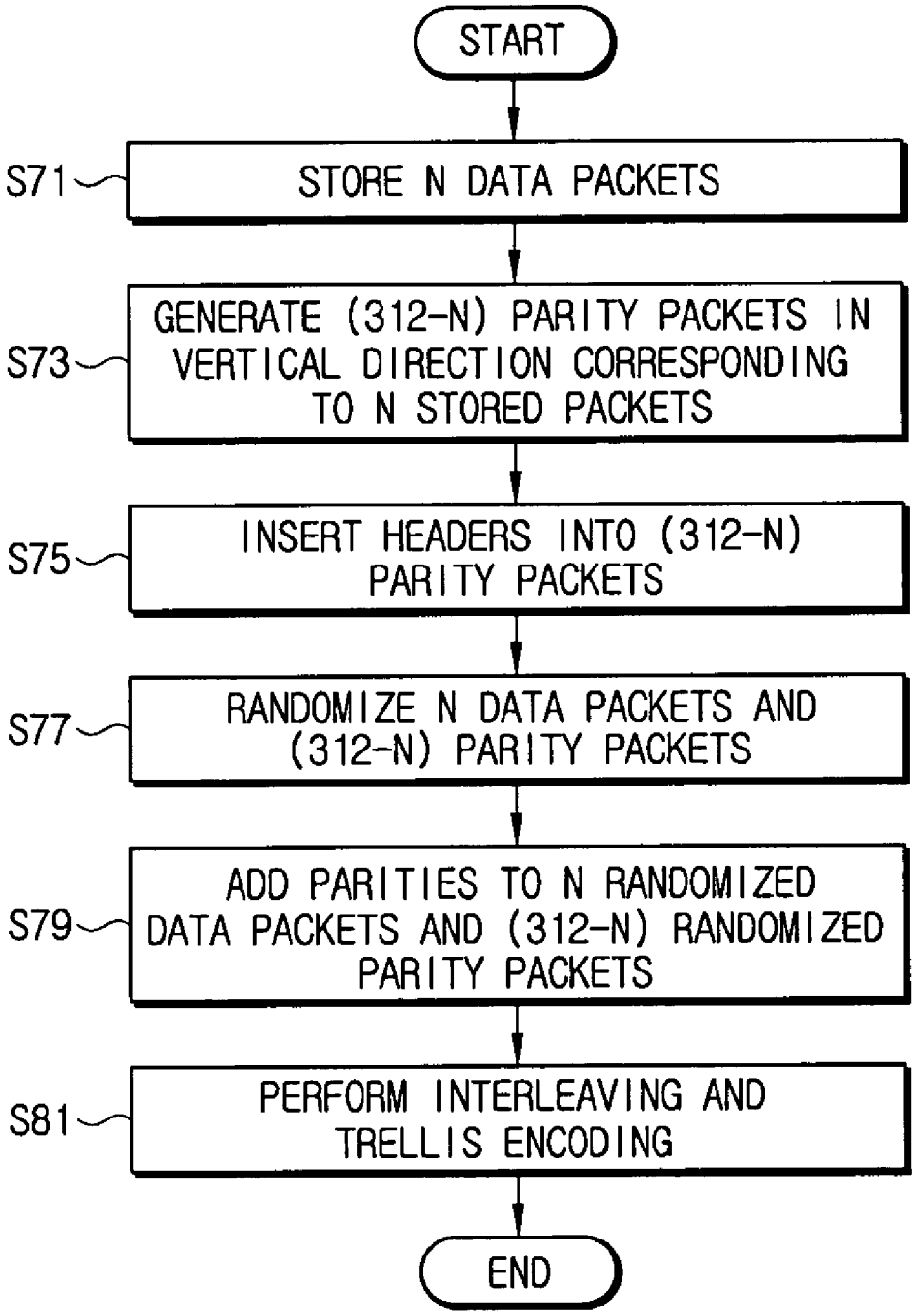
FIG. 8 is a flowchart illustrating an error correction coding method performed by the error correction coding device of FIG. 7.

FIG. 7 is a block diagram of an error correction coding device 700 according to another embodiment of the present invention, and FIG. 8 is a flowchart illustrating an error correction coding method performed by the error correction coding device 700 of FIG. 7. Hereinafter, the error correction coding process performed by the error correction coding device 700 according to another embodiment of the present invention will be explained in detail.

The error correction coding of the data packets MPEG2-TS-packetized by an MPEG transmitter system is performed along two paths. Here, the data packet may be either of a normal data packet and a robust data packet that is more robust than the normal data packet in the channel environment.

The first path processes the N data packets outputted through a FIFO unit 717, and the second path processes the (312-N) parity packets generated based on the N packets stored in a storage unit 711.

First, the storage unit 711 stores the N input data packets ((a) in FIG. 5) (step S71). The second RS encoder 713 generates (312-N)-byte parities ((d) in FIG. 5) in a vertical direction corresponding to a part, except for the header part, of the N stored packets (step S73).

A header inserter 715 inserts 3-byte headers ((c) in FIG. 5) to the generated (312-N) parity packets ((d) in FIG. 5) (step S75). The 3-byte header ((c) in FIG. 5) includes a PID (Packet Identifier) for discriminating the N data packets from the (312-N) parity packets.

The (312-N) parity packets ((c) and (d) in FIG. 5), to which the 3-byte headers are inserted through the header inserter 715, are inputted to a time divider 719.

Meanwhile, after the N-th data packet, which is the last data packet among the N data packets outputted from the FIFO unit 717 that is the first path, is inputted, the (312-N) parity packets outputted from the header inserter 715 are inputted to the time divider 719.

Accordingly, the data outputted from the time divider has the form composed of (a), (b) and (c) parts in FIG. 5.

The N data packets and the (312-N) parity packets outputted from the time divider 719 are randomized in a predetermined pattern through a randomizer 721 (step S77).

The first RS encoder 723 adds the 20-byte parities ((b) and (e) in FIG. 5) to the N data packets ((a) in FIG. 5) and the (312-N) parity packets ((c) and (d) in FIG. 5), respectively (step S79).

Thereafter, an interleaving and a trellis encoding are performed to complete the error correction encoding (step S81).

As described above, since the field data error-correction-encoded according to the embodiments of the present invention has the parity of the predetermined number of bytes per packet and the predetermined number of parity packets, the data can strongly be error-correction-encoded and then transmitted.

Figure 9:
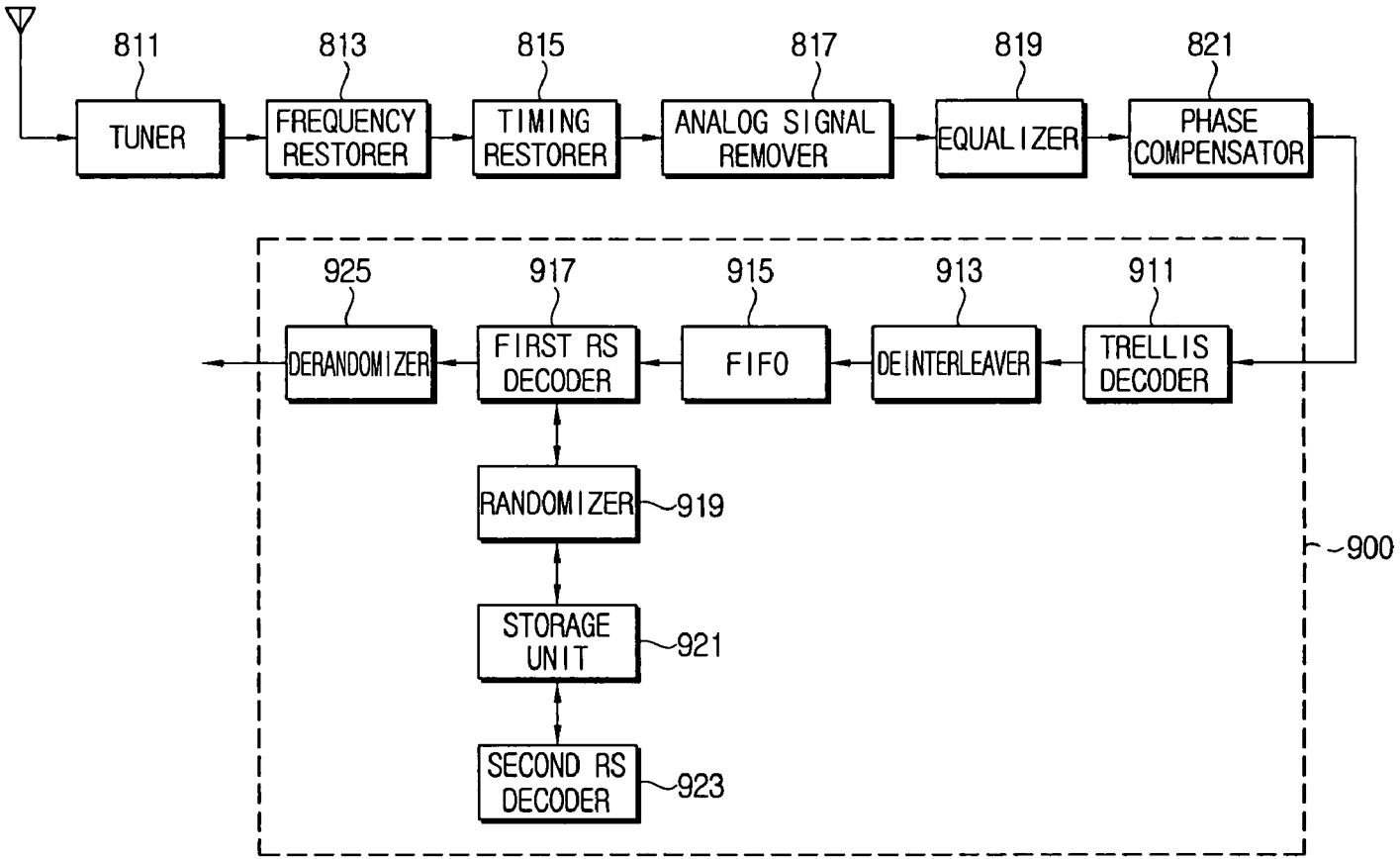
FIG. 9 is a schematic block diagram of a digital receiver system having an error correction decoding device according to the present invention.

FIG. 9 is a schematic block diagram of a digital receiver system having an error correction decoding device according to the present invention.

The digital receiver system includes a tuner 811, a frequency restorer 813, a timing restorer 815, an analog signal remover 817, an equalizer 819, a phase compensator 821, and an error correction decoding device 900.

The tuner 811 selects one of received band signals, and converts the selected band signal into a baseband signal.

The frequency restorer 813 and the timing restorer 815 restore a frequency offset and a timing offset of the received signal.

The analog signal remover 817 removes an analog signal included in the selected band signal.

The equalizer 819 removes an ISI (Inter-Symbol Interference) of the received signal, and the phase compensator 821 compensates for a phase error of the received signal.

The error correction decoding device 900 detects an error corresponding to the error correction coding method performed by the error correction coding device 400 or 700 of the digital transmitter system illustrated in FIGS. 4 and 7, and corrects the detected error.

Hereinafter, the error correction decoding device 900 of a digital receiver system according to the present invention will be explained in detail.

The error correction decoding device 900 includes a trellis decoder 911, a deinterleaver 913, a FIFO unit 915, a first RS decoder 917, a randomizer 919, a storage unit 921, a second RS decoder 923, and a derandomizer 925.

The trellis decoder 911 and the deinterleaver 913 perform a trellis decoding and a deinterleaving corresponding to the trellis encoding and the interleaving used in the transmitter.

The deinterleaved data packets are buffered. Here, the data packet may be either of a normal data packet and a robust data packet that is more robust than the normal data packet in the channel environment.

The first RS decoder 917 corrects errors in a horizontal direction of the field data using parities of a predetermined number of bytes included in the data packets.

The randomizer 919 randomizes the data in a predetermined pattern.

The second RS decoder 923 corrects the errors of the data packets in a vertical direction of the field data using parity packets.

The storage unit 921 stores the data error-corrected through the first and second RS decoders 917 and 923 and information on whether the errors are corrected.

The derandomizer 925 derandomizes the data packets error-corrected in the horizontal direction through the first RS decoder 917 in the predetermined pattern.

Through the above-described process, the error correction of the data of the digital receiver system is completed.

Figure 10:
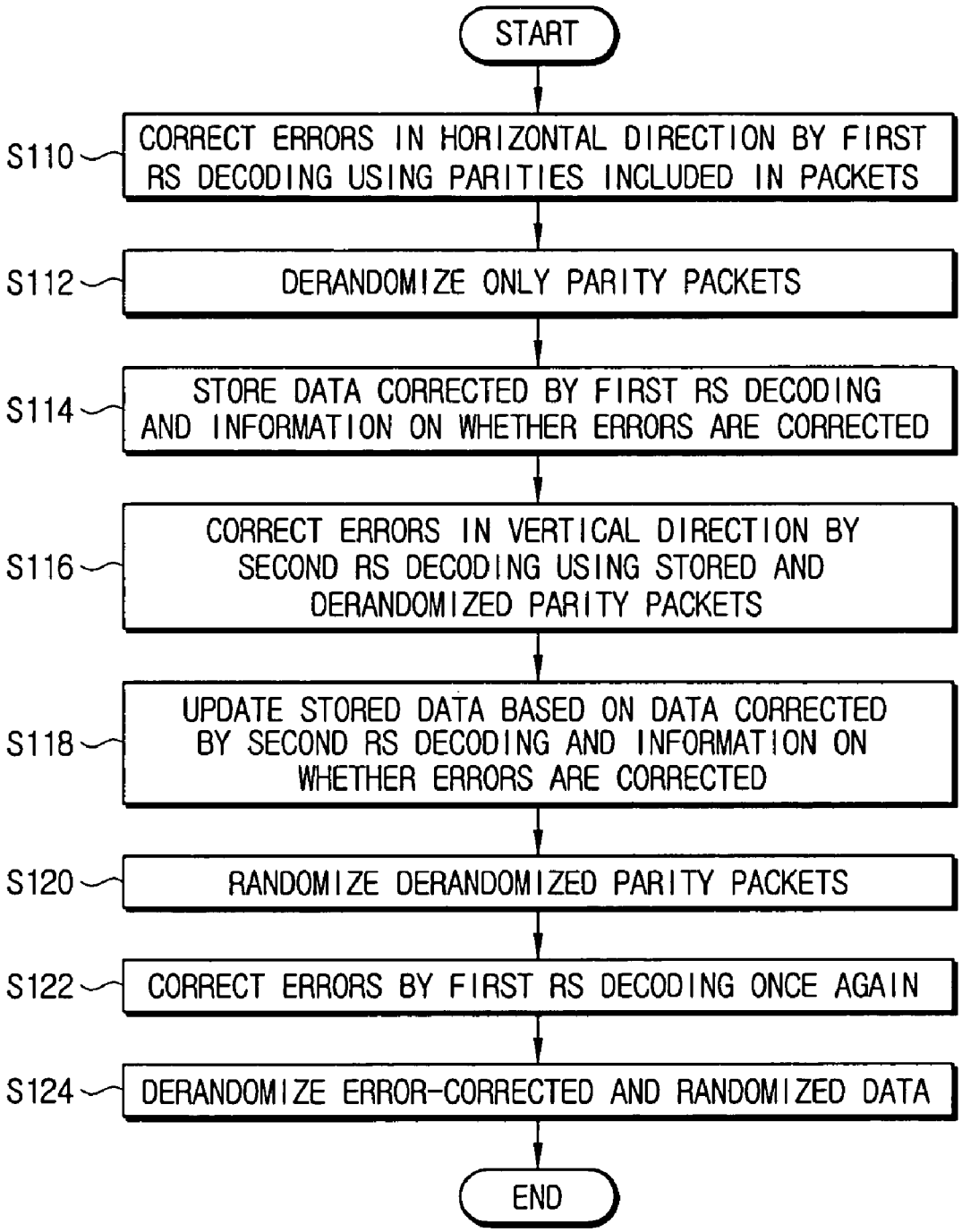
FIG. 10 is a flowchart illustrating an error correction method performed by the error correction decoding device of FIG. 7 according to an embodiment of the present invention.
Figure 11:
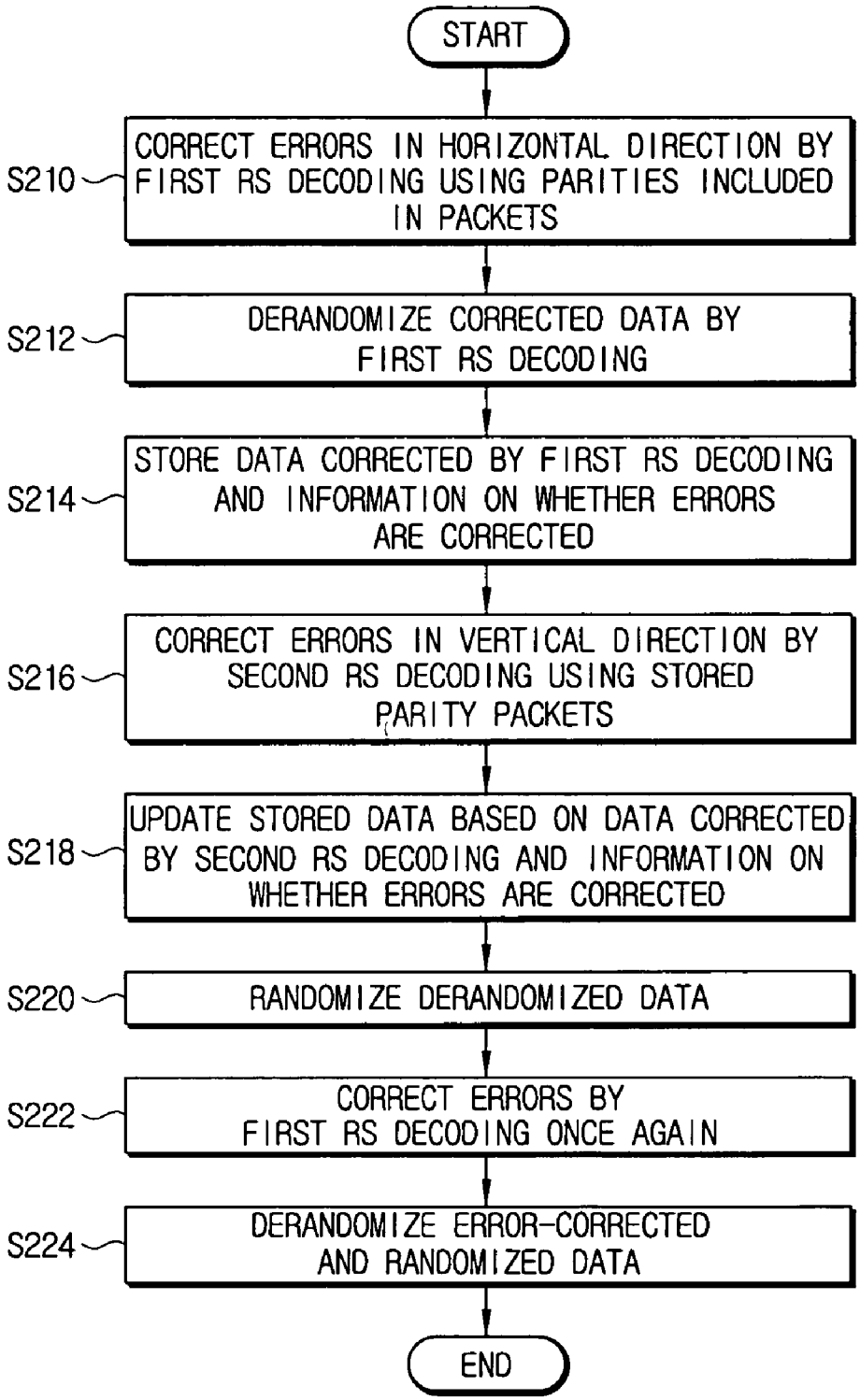
FIG. 11 is a flowchart illustrating an error correction method performed by the error correction decoding device of FIG. 7 according to an embodiment of the present invention.

FIG. 10 is a flowchart illustrating the error correction method corresponding to the error correction coding device 400 of FIG. 4, and FIG. 11 is a flowchart illustrating the error correction method corresponding to the error correction coding device 700 of FIG. 7 according to the present invention.

First, with reference to FIGS. 9 and 10, the error correction method corresponding to the error correction coding device 400 of FIG. 4 according to the present invention will be explained.

The data outputted from the deinterleaver 913 is inputted to the first RS decoder 917 through the FIFO unit 915.

The first RS decoder 917 corrects the errors in the horizontal direction of the field data ((a), (c) and (d) in FIG. 5) using the 20-byte parities ((b) and (e) in FIG. 5) included in the respective packets (step S110).

The randomizer 919 derandomizes only the parity packets ((c) and (d) in FIG. 5) among the 312 packets for the operation of the second RS decoder 923 (step S112). That is, since the parity packets generated from the second RS encoder 421 in the error correction coding device 400 of FIG. 4 are the derandomized data generated based on the N randomized data packets, the randomizer 919 derandomizes only the (312-N) parity packets except for the N data packets.

The storage unit 921 stores the data error-corrected in the horizontal direction through the first RS decoder 917 and the information on whether the errors are corrected (step S114).

The second RS decoder 923 corrects the errors of the N randomized data packets ((a) in FIG. 5) in the vertical direction using the derandomized parity packets ((c) and (d) in FIG. 5) stored in the storage unit 921 (step S116).

Then, the second RS decoder 923 updates the data stored in the storage unit 921 based on the data error-corrected in the vertical direction and the information on whether the errors are corrected (step S118).

The randomizer 919 again randomizes only the derandomized parity packets ((c) and (d) in FIG. 5) stored in the storage unit 921 in accordance with a predetermined control signal (step S120). That is, since the first RS encoder 417 of the error correction coding device 400 of FIG. 4 added the parities to the randomized data, the data should be randomized before the first RS decoder 917 performs the RS decoding.

The first RS decoder 923 performs the error correction once again with respect to the N randomized data packets and the (312-N) parity packets ((a), (c) and (d) in FIG. 5) using the 20-byte parities ((b) and (e) in FIG. 5) (step S122).

The derandomizer 925 derandomizes the error-corrected data in the predetermined pattern, so that the error correction in the receiver system is completed (step S124).

Next, with reference to FIGS. 9 and 11, the error correction method corresponding the error correction coding device 700 of FIG. 7 according to the present invention will be explained.

The data outputted from the deinterleaver 913 is inputted to the first RS decoder 917 through the FIFO unit 915.

The first RS decoder 917 corrects the errors in the horizontal direction of the N data packets and the (312-N) parity packets ((a), (c) and (d) in FIG. 5) using the 20-byte parities ((b) and (e) in FIG. 5) included in the respective packets (step S210).

The randomizer 919 derandomizes the 312 packets ((a), (c) and (d) in FIG. 5) error-corrected in the horizontal direction by the first RS decoder 917 (step S212). That is, since the parity packets generated from the second RS encoder 713 in the error correction coding device 700 of FIG. 7 are the derandomized data generated based on the N derandomized data packets, the randomizer 919 derandomizes all the N data packets and the (312-N) parity packets.

The storage unit 921 stores the data error-corrected through the first RS decoder 917 and the information on whether the errors are corrected (step S214).

The second RS decoder 923 corrects the errors of the N data packets ((a) in FIG. 5) in the vertical direction using the derandomized parity packets ((c) and (d) in FIG. 5) stored in the storage unit 921 (step S216).

Then, the second RS decoder 923 updates the data stored in the storage unit 921 based on the error-corrected data and the information on whether the errors are corrected (step S218).

The randomizer 919 again randomizes the N derandomized parity packets and the (312-N) parity packets ((a), (c) and (d) in FIG. 5) stored in the storage unit 921 (step S220). That is, since the first RS encoder 723 of the error correction coding device 700 of FIG. 7 added the parities to the randomized data, the data should be randomized before the first RS decoder 917 performs the RS decoding.

Thereafter, the first RS decoder 923 performs the error correction once again in the horizontal direction with respect to the 312 packets ((a), (c) and (d) in FIG. 5) using the 20-byte parities ((b) and (e) in FIG. 5) (step S222).

The derandomizer 925 derandomizes the error-corrected and randomized data in the predetermined pattern, so that the error correction in the receiver system is completed (step S224).

As described above, the error correction coding/decoding device for a digital transmitter/receiver system has a superior error correction capability by performing the error correction using parities of the predetermined number of bytes included in the packets and the predetermined number of parity packets, and thus it is possible to perform a stronger data transmission/reception in the inferior channel environments.

Also, the data coded by the error correction coding device for a digital transmitter system according to the present invention can be error-corrected by the existing receiver side error correction decoding device, and recognized and processed as a null packet of the parity packets.

According to the present invention, the transmitter generates parities of the predetermined number of bytes included in the packets and the predetermined number of parity packets, and the receiver performs an error correction using the parities existing in the horizontal and vertical directions with respect to the field data structure, so that a stronger error correction can be achieved.

Also, by preparing headers and parities of the predetermined number of bytes with respect to the predetermined number of parity packets, the system according to the present invention is compatible with the existing receiver system.

The foregoing embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

[1. An error correction coding device for a digital transmitter system comprising:

a first RS (Reed-Solomon) encoder for adding parities of a predetermined number of bytes to a predetermined number of data packets, respectively;

a storage unit for storing the data packets having the parities of the predetermined number of bytes added thereto; and a second RS encoder for generating parity packets corresponding to the stored data packets;

wherein the first RS encoder adds the parities of the predetermined number of bytes to the parity packets, and the storage unit stores the parity packets having the parities of the predetermined number of bytes added thereto; and wherein the second RS encoder generates the parity packets corresponding to a remaining part of the data packets except for a header part and the parities.]

[2. The error correction coding device as claimed in claim 1, wherein the data packets comprise normal data packets.]

[3. The error correction coding device as claimed in claim 1, wherein the data packets comprise robust data packets, which are more robust than normal data packets.]

[4. The error correction coding device as claimed in claim 1, wherein the second RS encoder generates parity packets, with respect to the data packets with the parities except for a header part, including a predetermined-byte parity and being stored in the storage unit, and said second RS encoder rearranges the parity packets including the predetermined-byte parity with the parities.]

[5. The error correction coding device as claimed in claim 1, further comprising a header inserter for inserting headers to the parity packets generated from the second RS encoder, respectively;

wherein the first RS encoder adds the parities of the predetermined number of bytes to the parity packets, and the storage unit stores the parity packets having the parities of the predetermined number of bytes added thereto.]

[6. The error correction coding device as claimed in claim 1, further comprising a randomizer for randomizing the data packets and the parity packets in a predetermined pattern before the first RS encoder adds the parities of the predetermined number of bytes thereto;

wherein the first RS encoder adds the parities of the predetermined number of bytes to the parity packets, and the storage unit stores the parity packets having the parities of the predetermined number of bytes added thereto.]

[7. An error correction coding method for a digital transmitter system comprising:

a first encoding step of adding parities of a predetermined number of bytes to a predetermined number of data packets, respectively;

a step of storing the data packets having the parities of the predetermined number of bytes added thereto;

a second encoding step of generating the parity packets corresponding to the stored data packets; and a third encoding step of adding the parities of the predetermined number of bytes to the parity packets;

wherein the second encoding step generates the parity packets corresponding to a remaining part of the data packets except for a header part and the parities.]

[8. The error correction coding method as claimed in claim 7, wherein the data packets comprise normal data packets.]

[9. The error correction coding method as claimed in claim 7, wherein the data packets comprise robust data packets, which are more robust than normal data packets.]

[10. The error correction coding method as claimed in claim 7, wherein the second encoding step comprises the steps of:

generating parity packets with respect to the data packets which contain a predetermined-byte parity and are stored in the storage unit with the parities except for the header part; and re-arranging the parity packets which contain a predetermined-byte parity with the parities.]

[11. The error correction coding method as claimed in claim 7, further comprising a step of inserting headers into the parity packets generated at the second encoding step.]

[12. The error correction coding method as claimed in claim 7, further comprising a step of randomizing the data packets and the parity packets in a predetermined pattern.]

[13. An error correction coding device for a digital transmitter system comprising:

a storage unit for storing a predetermined number of data packets;

a first RS (Reed-Solomon) encoder for generating parity packets corresponding to the stored data packets;

a randomizer for randomizing the data packets and the parity packets in a predetermined pattern; and a second RS encoder for adding parities of a predetermined number of bytes to the randomized data packets and parity packets.]

[14. The error correction coding device as claimed in claim 13, wherein the data packets comprise normal data packets.]

[15. The error correction coding device as claimed in claim 13, wherein the data packets comprise robust data packets, which are more robust than normal data packets.]

[16. The error correction coding device as claimed in claim 13, wherein the first RS encoder generates the parity packets corresponding to a remaining part of the data packets except for a header part.]

[17. The error correction coding device as claimed in claim 13, further comprising a header inserter for inserting headers to the parity packets generated from the first RS encoder, respectively.]

[18. An error correction coding method for a digital transmitter system comprising:

a step of storing a predetermined number of data packets;

a first encoding step of generating parity packets corresponding to the stored data packets;

a step of randomizing the data packets and the parity packets in a predetermined pattern; and a second encoding step of adding parities of a predetermined number of bytes to the randomized data packets and parity packets.]

[19. The error correction coding method as claimed in claim 18, wherein the data packets comprise normal data packets.]

[20. The error correction coding method as claimed in claim 18, wherein the data packets comprise robust data packets, which are more robust than normal data packets.]

[21. The error correction coding method as claimed in claim 18, wherein the first encoding step generates the parity packets corresponding to a remaining part of the data packets except for a header part.]

[22. The error correction coding method as claimed in claim 18, further comprising the step of inserting headers to the parity packets generated at the first encoding step, respectively.]

[23. An error correction coding device for a digital transmitter system comprising:

a first encoder for generating parity packets corresponding to a predetermined number of data packets; and a second encoder for adding parities of a predetermined number of bytes to the data packets and the parity packets;

wherein the parities added by the second encoder are generated based on a part of the data packets excluding a header part and a parity part.]

[24. The error correction coding device as claimed in claim 23, wherein the data packets comprise normal data packets.]

[25. The error correction coding device as claimed in claim 23, wherein the data packets comprise robust data packets, which are more robust than normal data packets.]

[26. An error correction coding method for a digital transmitter system comprising:

a first encoding step of generating parity packets corresponding to a predetermined number of data packets; and a second encoding step of adding parities of a predetermined number of bytes to the data packets and the parity packets;

wherein the parities added by the second encoder are generated based on a part of the data packets excluding a header part and a parity part.]

[27. The error correction coding method as claimed in claim 26, wherein the data packets comprise normal data packets.]

[28. The error correction coding method as claimed in claim 26, wherein the data packets comprise robust data packets, which are more robust than normal data packets.]

[29. A digital transmitter system comprising:

an error correction coding unit for generating parity packets corresponding to a predetermined number of data packets, and coding the data packets and the parity packets by adding parities of a predetermined number of bytes to the data packets and the parity packets, respectively;

a sync signal inserter for inserting a sync signal into the coded data;

a pulse shaping filter for pulse-shaping the data into which the sync signal is inserted; and a radio frequency (RF) unit for converting the pulse-shaped data into a signal of a transmission channel band and transmitting the converted signal;

wherein the error correction coding unit comprises a first RS (Reed-Solomon) encoder for adding the parities of the predetermined number of bytes to the predetermined number of data packets, respectively, a storage unit for storing the data packets having the parities of the predetermined number of bytes added thereto, and a second RS encoder for generating the parity packets corresponding to the stored data packets; and wherein the first RS encoder adds the parities of the predetermined number of bytes to the parity packets, and the storage unit stores the parity packets having the parities of the predetermined number of bytes added thereto.]

[30. The digital transmitter system as claimed in claim 29, wherein the data packets comprise normal data packets.]

[31. The digital transmitter system as claimed in claim 29, wherein the data packets comprise robust data packets, which are more robust than normal data packets.]

[32. The digital transmitter system as claimed in claim 29, wherein the second RS encoder generates the parity packets corresponding to a remaining part of the data packets except for a header part.]

[33. The digital transmitter system as claimed in claim 29, wherein the second RS encoder generates parity packets, with respect to the data packets with the parities except for the header part, including a predetermined-byte parity and being stored in the storage unit, and said second RS encoder rearranges the parity packets including the predetermined-byte parity with the parities.]

[34. The digital transmitter system as claimed in claim 29, further comprising a header inserter for inserting headers to the parity packets generated from the second RS encoder, respectively.]

[35. The digital transmitter system as claimed in claim 29, further comprising a randomizer for randomizing the data packets and the parity packets in a predetermined pattern.]

[36. A digital transmitter system comprising:

an error correction coding unit for generating parity packets corresponding to a predetermined number of data packets, and coding the data packets and the parity packets by adding parities of a predetermined number of bytes to the data packets and the parity packets, respectively;

a sync signal inserter for inserting a sync signal into the coded data;

a pulse shaping filter for pulse-shaping the data into which the sync signal is inserted; and a radio frequency (RF) unit for converting the pulse-shaped data into a signal of a transmission channel band and transmitting the converted signal;

wherein the error correction coding unit comprises a storage unit for storing the data packets, a second RS encoder for generating the parity packets corresponding to the stored data packets, a randomizer for randomizing the data packets and the parity packets in a predetermined pattern, and a first RS encoder for adding the parities of the predetermined number of bytes to the randomized data packets and parity packets.]

[37. The digital transmitter system as claimed in claim 36, wherein the second RS encoder generates the parity packets corresponding to a remaining part of the data packets except for a header part.]

[38. The digital transmitter system as claimed in claim 36, further comprising a header inserter for inserting headers to the parity packets generated from the second RS encoder, respectively.]

[39. An error correction decoding device for a digital receiver system comprising:

a first RS (Reed-Solomon) decoder for correcting errors of a predetermined number of data packets using parities of a predetermined number of bytes included in the data packets;

a storage unit for storing the error-corrected data packets; and a second RS decoder for correcting errors of the data packets using the-parity packets;

wherein the second RS decoder updates the data packets stored in the storage unit based on the error-corrected data packets.]

[40. The error correction decoding device as claimed in claim 39, wherein the data packets comprise normal data packets.]

[41. The error correction decoding device as claimed in claim 39, wherein the data packets comprise robust data packets, which are more robust than normal data packets.]

[42. The error correction decoding device as claimed in claim 39, further comprising a randomizer for derandomizing the parity packets in a predetermined pattern;

wherein the second RS decoder corrects the errors of the data packets using the derandomized parity packets.]

[43. The error correction decoding device as claimed in claim 39, wherein the first RS decoder performs the error correction once again with respect to the updated data packets.]

[44. An error correction method for a digital receiver system comprising:

a first decoding step of correcting errors of a predetermined number of data packets using parities of a predetermined number of bytes included in the data packets;

a step of storing the error-corrected data packets;

a second decoding step of correcting errors of the data packets error-corrected at the first decoding step using parity packets;

a step of updating the stored data packets based on the data packets error-corrected at the second decoding step; and a third decoding step of correcting errors of the updated data packets using the parities of the predetermined number of bytes.]

[45. The error correction method as claimed in claim 44, wherein the data packets comprise normal data packets.]

[46. The error correction method as claimed in claim 44, wherein the data packets comprise robust data packets, which are more robust than normal data packets.]

[47. The error correction method as claimed in claim 44, further comprising the step of derandomizing the parity packets in a predetermined pattern before the second decoding step.]

[48. The error correction method as claimed in claim 47, further comprising the step of randomizing the derandomized parity packets in the predetermined pattern before the third decoding step.]

[49. An error correction decoding device for a digital receiver system comprising:

a first RS (Reed-Solomon) decoder for correcting errors of a predetermined number of data packets using parities of a predetermined number of bytes included in the data packets;

a randomizer for derandomizing the data packets and parity packets in a predetermined pattern;

a storage unit for storing the error-corrected data packets; and a second RS decoder for correcting errors of the data packets using the parity packets;

wherein the second RS decoder updates the data packets stored in the storage unit based on the error-corrected data packets.]

[50. The error correction decoding device as claimed in claim 49, wherein the data packets comprise normal data packets.]

[51. The error correction decoding device as claimed in claim 49, wherein the data packets comprise robust data packets, which are more robust than normal data packets.]

[52. The error correction decoding device as claimed in claim 49, wherein the first RS decoder performs the error correction once again with respect to the updated data packets.]

[53. An error correction decoding method for a digital receiver system comprising:

a first decoding step of correcting errors of a predetermined number of data packets using parities of a predetermined number of bytes included in the data packets;

a step of derandomizing the data packets and parity packets in a predetermined pattern; a step of storing the data packets error-corrected at the first decoding step;

a second decoding step of correcting errors of the data packets error-corrected at the first decoding step using the parity packets;

a step of updating the stored data packets based on the data packets error-corrected at the second decoding step; and a third decoding step of correcting errors of the updated data packets using the parities of the predetermined number of bytes.]

[54. The error correction decoding method as claimed in claim 53, wherein the data packets comprise normal data packets.]

[55. The error correction decoding method as claimed in claim 53, wherein the data packets comprise robust data packets, which are more robust than normal data packets.]

[56. The error correction decoding method as claimed in claim 53, further comprising the step of randomizing the derandomized parity packets and parity packets in the predetermined pattern before the third decoding step.]

[57. A digital receiver system comprising:

a tuner for converting a received signal of a selected band into a baseband signal;

a frequency and timing restorer for restoring a frequency offset and a timing offset of the received signal;

an analog signal remover for removing an analog signal included in the received signal;

an equalizer for removing an inter-symbol interference of the received signal;

an error correction decoding unit for correcting errors of data packets of the received signal using parities of a predetermined number of bytes and parity packets; and a randomizer for derandomizing the parity rackets in a predetermined pattern;

wherein the second RS decoder corrects the errors of the data packets using the derandomized parity packets;

wherein the error correction decoding unit comprises a first RS decoder for correcting the errors of the predetermined number of data packets using the parities of the predetermined number of bytes included in the data packets, a storage unit for storing the error-corrected data packets, and a second RS decoder for correcting the errors of the data packets using the parity packets; and wherein the second RS decoder updates the data packets stored in the storage unit based on the error-corrected data packets.]

[58. The digital receiver system as claimed in claim 57, wherein the data packets comprise normal data packets.]

[59. The digital receiver system as claimed in claim 57, wherein the data packets comprise robust data packets, which are more robust than normal data packets.]

[60. The digital receiver system as claimed in claim 57, wherein the first RS decoder performs the error correction once again with respect to the updated data packets.]

[61. The digital receiver system as claimed in claim 57, wherein the error correction decoding unit comprises a first RS decoder for correcting the errors of the predetermined number of data packets using the parities of the predetermined number of bytes included in the data packets, a randomizer for derandomizing the data packets and parity packets in a predetermined pattern, a storage unit for storing the error-corrected data packets, and a second RS decoder for correcting the errors of the data packets using the parity packets; and wherein the second RS decoder updates the data packets stored in the storage unit based on the error-corrected data packets.]

[62. The digital receiver system as claimed in claim 61, wherein the data packets comprise normal data packets.]

[63. The digital receiver system as claimed in claim 61, wherein the data packets comprise robust data packets, which are more robust than normal data packets.]

[64. The digital receiver system as claimed in claim 61, wherein the first RS decoder performs the error correction once again with respect to the updated data packets.]

*65. A digital broadcasting receiver comprising:*

*a tuner which receives a stream comprising a plurality of data packets from a transmitter and provides the received stream;*

*an error correction decoder which receives the provided stream provided from the tuner and corrects errors of the provided stream provided from the tuner,*

*wherein the received stream comprises:*

*a data area;*

*a first parity area generated by encoding the data area in a vertical direction; and*

*a second parity area generated by encoding the data area and the first parity area in a horizontal direction,*

*wherein the stream received from the transmitter is time-divided to at least two packet groups comprising a first packet group and a second packet group, wherein the first packet group and the second packet group are randomized separately.*

*66. The digital broadcast receiver of claim 65, wherein the error correction decoder comprises:*

*a first Reed-Solomon (RS) decoder which corrects errors of the stream in the horizontal direction using the second parity area; and*

*a second RS decoder which corrects errors of the stream in the vertical direction using the first parity area.*

*67. The digital broadcast receiver of claim 66, wherein the error correction decoder further comprises:*

*a trellis decoder which trellis-decodes the stream;*

*a deinterleaver which deinterleaves the trellis-decoded stream;*

*a First-In First-Out (FIFO) unit which stores the deinterleaved stream and outputs the stored stream to the first RS decoder;*

*a randomizer which derandomizes the first parity area and outputs the derandomized parity area; and*

*a storage unit which stores data decoded by the first RS decoder and second RS decoder,*

*wherein the second RS decoder corrects the errors of the stream in the vertical direction using the derandomized first parity area.*

*68. The digital broadcast receiver of claim 65, wherein the stream is a robust data stream processed to be robust against errors.*

*69. A stream processing method in a digital broadcast receiver, the method comprising:*

*receiving, by a tuner a stream comprising a plurality of data packets from a transmitter and providing, by the tuner, the received stream;*

*correcting errors of the provided stream provided by the tuner,*

*wherein the received stream comprises:*

*a data area;*

*a first parity area generated by encoding the data area in a vertical direction; and*

*a second parity area generated by encoding the data area and the first parity area in a horizontal direction,*

*wherein the stream received from the transmitter is time-divided to at least two packet groups comprising a first packet group and a second packet group, wherein the first packet group and the second packet group, are randomized separately.*

*70. The method of claim 69, wherein the correcting comprises:*

*a first Reed-Solomon (RS) decoding operation which corrects errors of the stream in the horizontal direction using the second parity area; and*

*a second RS decoding operation which corrects errors of the stream in the vertical direction using the first parity area.*

*71. The method of claim 69, wherein the correcting further comprises:*

*trellis-decoding the stream;*

*deinterleaving the trellis-decoded stream;*

*a first RS decoding operation which corrects errors of the stream in the horizontal direction using the second parity area;*

*derandomizing the first parity area; and*

*a second RS decoding operation which corrects errors of the stream in the vertical direction using the derandomized first parity area.*

*72. The method of claim 69, wherein the stream is a robust data stream processed to be robust against errors.*

* * * * *